United States Patent
Mutikainen et al.

(10) Patent No.: US 11,489,461 B2
(45) Date of Patent: Nov. 1, 2022

(54) THIN FILM ACTUATOR HAVING TRANSVERSELY ORIENTED STRUCTURAL STIFFENERS TO INCREASE ACTUATOR STROKE

(71) Applicant: MICROSOFT TECHNOLOGY LICENSING, LLC, Redmond, WA (US)

(72) Inventors: Risto Heikki Mutikainen, Espoo (FI); Tommi Riekkinen, Espoo (FI); Marco Mattila, Espoo (FI); Nikolay Chekurov, Espoo (FI)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 347 days.

(21) Appl. No.: 16/883,605

(22) Filed: May 26, 2020

(65) Prior Publication Data

US 2021/0376772 A1 Dec. 2, 2021

(51) Int. Cl.
| | |
|---|---|
| *H02N 2/04* | (2006.01) |
| *G02B 26/08* | (2006.01) |
| *H02N 2/02* | (2006.01) |
| *H02N 2/06* | (2006.01) |
| *H01L 41/187* | (2006.01) |

(52) U.S. Cl.
CPC ......... *H02N 2/043* (2013.01); *G02B 26/0858* (2013.01); *H02N 2/028* (2013.01); *H02N 2/065* (2013.01); *H01L 41/1876* (2013.01)

(58) Field of Classification Search
CPC ........ H02N 2/043; H02N 2/028; H02N 2/065; H01L 41/1876; H01L 41/094; B81B 3/0043; G02B 26/0858
See application file for complete search history.

(56) References Cited

U.S. PATENT DOCUMENTS

| | | | |
|---|---|---|---|
| 7,372,348 B2* | 5/2008 | Xu | H01L 41/094 335/78 |
| 7,893,602 B1 | 2/2011 | Schiller et al. | |
| (Continued) | | | |

OTHER PUBLICATIONS

"International Search Report and Written Opinion Issued in PCT Application No. PCT/US21/028269", dated Jul. 26, 2021, 11 Pages.

*Primary Examiner* — Emily P Pham
(74) *Attorney, Agent, or Firm* — Newport IP, LLC; Jacob P. Rohwer

(57) ABSTRACT

A thin film actuator having transversely oriented structural stiffeners that serve to increase actuation stroke that results from longitudinal curvature. The thin film actuator may be deployed within electromechanical devices such that an actuatable deflection of a tip of the actuator plate produces the actuation stroke. The thin film actuator may include an actuator plate affixed to a substantially rigid frame structure. The actuator plate protrudes along a longitudinal axis away from the frame structure such that the actuator plate is cantilevered from the frame structure by some distance along this longitudinal axis. The thin film actuator includes a piezoelectric film on a surface of the actuator plate. Activation of the piezoelectric film generates tensile stress or compressive stress at the surface, thereby inducing a bending moment that causes the actuator plate to undergo longitudinal curvature and some lesser degree of transverse curvature.

20 Claims, 12 Drawing Sheets

(56) References Cited

U.S. PATENT DOCUMENTS

| | | | |
|---|---|---|---|
| 9,070,392 B1 | 6/2015 | Bjorstrom | |
| 10,457,544 B2 | 10/2019 | Schenk et al. | |
| 2004/0094815 A1* | 5/2004 | Park | H01L 41/332 257/415 |
| 2020/0241286 A1* | 7/2020 | Ishida | B81B 3/00 |

* cited by examiner

THIN FILM ACTUATOR HAVING TRANSVERSELY ORIENTED STRUCTURAL STIFFENERS TO INCREASE ACTUATOR STROKE

BACKGROUND

Thin film actuators are widely used in electromechanical devices to cause controlled movements of a component by applying a drive signal to a piezoelectric material. For example, microelectromechanical systems (MEMS) scanning devices modulate the angular position of a scanning mirror with extremely high accuracy by applying external electric fields to piezoelectric films that have been deposited over top and/or bottom surfaces of actuator plates that are mechanically coupled to the scanning mirror. As a piezoelectric film expands or contracts, mechanical stress is induced at whichever surface of the actuator plate the piezoelectric film is attached. This mechanical stress generates a bending moment within the actuator plate which causes longitudinal curvature that results in an actuator stroke (e.g., tip deflection in a vertical direction). The amount of actuator stroke is inversely related to both the planar second moment of area (also referred to herein as "moment of inertia" or "area moment of inertia" or "bending stiffness") for planar cross sections taken along a longitudinal axis and Young's modulus of the actuator plate material, and proportional to the square of the actuator length in a longitudinal direction. The longitudinal direction refers specifically to the direction which the actuator plate extends cantilevered from a frame. Furthermore, a transverse direction refers to a direction that is orthogonal to the longitudinal direction and on plane with a top surface of the actuator plate. Finally, a vertical direction is orthogonal to both of the longitudinal and transverse directions.

Importantly, the smaller the moments of inertia of the actuator plate at various planar cross-sections along the longitudinal axis, the greater the actuator stroke that will result from any particular bending moment within that actuator plate. Depending on the device design, high enough actuation force is also needed. Producing sufficient actuator stroke and force is a challenge in many thin film actuator applications. Therefore, actuator plates are often designed to be thin and flat in terms of height because these geometric characteristics minimize the moment of inertia along the longitudinal axis, thereby increasing the longitudinal curvature of the actuator plate for any particular bending moment.

Unfortunately, the mechanical actuation that is induced into a typical actuator plate via activation of a piezoelectric film results in some degree of transverse curvature which increases rapidly the moment of inertia, of the actuator plate, along the longitudinal axis. Since actuator stroke is inversely related to this moment of inertia, this transverse curvature has the performance impeding effect of decreasing the actuator stroke and force. That is, increased transverse curvature tends to increase the stiffness of the actuator plate along the longitudinal axis, which in turn decreases the mode of longitudinal curvature which is specifically desired so as to produce actuator stroke.

It is with respect to these and other considerations that the disclosure made herein is presented.

SUMMARY

Technologies described herein provide a thin film actuator having transversely oriented structural stiffeners (e.g., ribs) that serve to increase actuation stroke that results from a bending mode associated with longitudinal curvature. Embodiments of the thin film actuator described herein are deployed within electromechanical devices such that an actuatable deflection of a tip of the actuator plate in a vertical direction produces the actuation stroke. Generally described, a thin film actuator may include an actuator plate that is mechanically coupled to a substantially rigid frame structure. The actuator plate is cantilevered from the frame structure by some distance along a longitudinal axis. The thin film actuator includes a piezoelectric film on a surface of the actuator plate. Activation of the piezoelectric film generates tensile stress or compressive stress at the surface, thereby inducing an internal moment that causes the actuator plate to bend with some degree of longitudinal curvature (and with some lesser degree of transverse curvature).

As described herein, the greater the amount of longitudinal curvature induced into the actuator plate, the greater the effective actuator stroke of the thin film actuator. Accordingly, the thin film actuator may further include a plurality of structural stiffeners that are oriented transversely so as to reduce or substantially eliminate an amount of transverse curvature that is induced into the actuator plate during activation of piezoelectric film. Mitigating this bending mode associated with transverse curvature tends to prevent a moment of inertia of the planar cross sections taken along the longitudinal from increasing. Therefore, mitigating the bending mode associated with transverse curvature serves as an effective mechanism for increasing the bending mode associated with longitudinal curvature (e.g., the desired mode of curvature as it corresponds to actuator stroke).

To illustrate this point, consider that many piezoelectric materials expand and contract isotopically and, therefore, generate stress in substantially all directions when activated (e.g., by application of a drive signal or voltage). This isotopically induced stress can be described in terms of both longitudinal and transverse components of stress which induce longitudinal curvature and transverse curvature, respectively. For purposes of the immediate illustration, presume that the longitudinal curvature is desirable in the sense that the greater the longitudinal curvature the greater the actuatable stroke. It will be appreciated that the amount of longitudinal curvature decreases as the bending stiffness increases along the longitudinal axis. Since the bending stiffness along the longitudinal axis will tend to increase as a result of transverse curvature, reducing transverse curvature serves as an effective means of increasing the desired mode of bending associated with longitudinal curvature that produces actuatable stroke. For this reason, various embodiments of the thin film actuators described herein include structural stiffeners that are transversely oriented to increase the tendency of the actuator plate to resist the mode of bending associated with transverse curvature. In particular, the transversely oriented structural stiffeners reduce (or even substantially eliminate) the amount of transverse curvature that results from the transverse stress component.

In an example embodiment, a microelectromechanical systems (MEMS) actuation device includes an actuator plate, a piezoelectric film deposited on a top surface of the actuator plate, and a plurality of structural stiffeners protruding from a bottom surface of the actuator plate that is opposite the top surface. An exemplary piezoelectric film may be formed from lead zirconate titanate (PZT). A base of the actuator plate is mechanically coupled to a frame structure and the actuator plate protrudes away from the frame structure along a longitudinal axis extending from the base to a tip of the actuator plate. In this way, the actuator plate is cantilevered from the frame structure.

Activation of the piezoelectric film via a drive signal (e.g., a voltage applied by a controller with extremely high accuracy) causes the piezoelectric film to expand and/or contract in plane. This deformation of the piezoelectric film produces compressive and/or tensile stress having both longitudinal and transverse components, in typical case equal to each other, and then called biaxial stress state. The longitudinal component may induce longitudinal curvature which, as described above, directly corresponds to actuatable tip deflection (e.g., actuator stroke). The greater the amount of induced longitudinal curvature, the greater the actuatable stroke of the MEMS actuation device. Furthermore, the amount of this longitudinal curvature will tend to decrease as the moment of inertia (bending stiffness) of the MEMS actuation device increases at the planar cross sections taken along the longitudinal axis. Since transverse curvature will tend to increase the bending stiffness along the longitudinal axis, minimizing the mode of bending associated with transverse curvature may be desirable. The plurality of structural stiffeners that protrude from the bottom surface of the actuator plate are included so as to prevent this mode of bending associated with transverse curvature.

In some embodiments, the actuator plate has a nominal thickness that is at least three times greater than that of the piezoelectric film. Furthermore, the individual structural stiffeners may protrude from the actuator plate a distance that is at least three times the nominal thickness of the actuator plate. As a specific but nonlimiting example, the actuator plate may have a nominal thickness (i.e., a design thickness) of thirty-five micrometers (35 µm) whereas the piezoelectric film may have a nominal thickness of less than five micrometers (5 µm). Furthermore, the individual structural stiffeners may extend more than one-hundred micrometers (100 µm) from the bottom surface of the actuator plate. Thus, it can be appreciated that in some embodiments, the individual stiffeners may protrude a height that is greater than more than one hundred times the nominal thickness of the piezoelectric film.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

Figure 1:
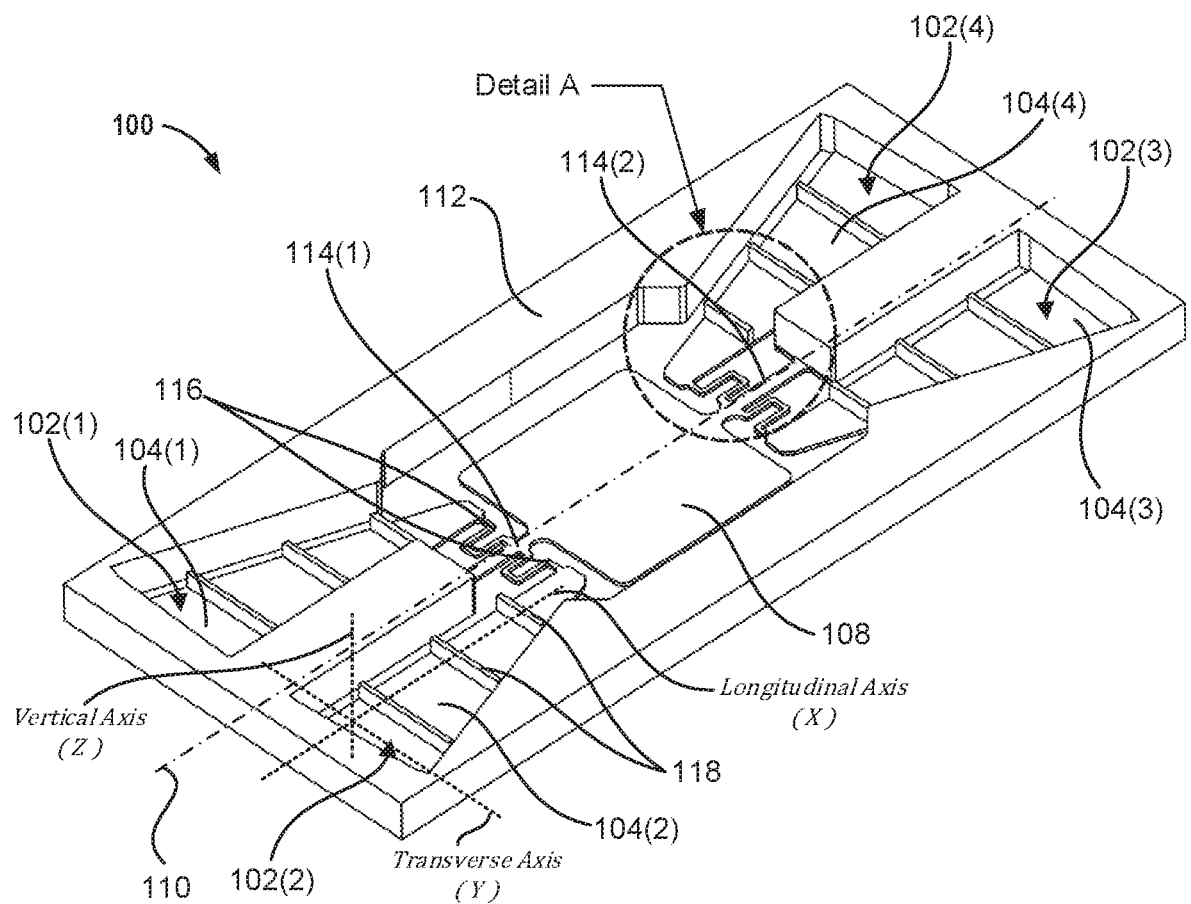
FIG. 1 illustrates an exemplary microelectromechanical systems (MEMS) scanning device that includes a set of thin film actuators that each include transversely oriented structural stiffeners and that are actuatable to cause a scanning mirror to rotate about a rotational axis.

This Detailed Description describes a thin film actuator having transversely oriented structural stiffeners that serve to increase actuation stroke. Generally described, embodiments of the thin film actuator described herein may be deployed within electromechanical devices such that an actuatable deflection of some portion of the actuator plate in a desired direction corresponds to an effective actuator stroke. For example, a thin film actuator may include an actuator plate and/or deposited thin actuation film that is mechanically coupled to and protrudes along a longitudinal axis away from a substantially rigid frame structure. In this way, the actuator plate is cantilevered from the frame structure by some distance along this longitudinal axis. The thin film actuator may further include a piezoelectric film on a top surface of the actuator plate. Activation of the piezoelectric film generates tensile stress or compressive stress at the top surface, thereby inducing an bending moment that causes the actuator plate to deform in accordance with longitudinal curvature such that the tip of the actuator bends upwards and/or downwards (e.g., in a positive or negative vertical directions) thereby producing actuator stroke. In some embodiments described herein, the greater the amount of longitudinal curvature which occurs, the greater the effective actuator stroke of the thin film actuator. Accordingly, the thin film actuator may further include a plurality of structural stiffeners that are oriented transversely so as to reduce or substantially eliminate an amount of transverse curvature which occurs by increasing the bending stiffness along the transverse axis. Mitigating this transverse curvature tends to prevent a bending stiffness from increasing along the longitudinal axis and, therefore, serves as an effective mechanism for increasing the mode of bending associated with longitudinal curvature (e.g., the desired mode of bending/curvature as it corresponds to actuator stroke).

To illustrate this point, consider the combined bending modes that occur when activation of a piezoelectric film causes mechanical stress at a surface of an actuator plate. Presuming that the mechanical stress includes both longitudinal and transverse components, it will be appreciated that these longitudinal and transverse stress components will induce bending modes associated with longitudinal curvature and transverse curvature, respectively. As described above, the mode of bending associated with longitudinal curvature is desirable since the greater the longitudinal curvature the greater the actuatable stroke. That is, the more longitudinal curvature induced into the actuator plate, the farther the tip deflection of the actuator plate. As further described above, the amount of longitudinal curvature will decrease as the bending stiffness increases along the longitudinal axis. Since the bending stiffness along the longitudinal axis will tend to increase as a result of transverse curvature, reducing or eliminating transverse curvature may serve as an effective means of increasing the amount of achievable longitudinal curvature (and therefore actuatable stroke). For this reason, various embodiments of the thin film actuators described herein include structural stiffeners that are substantially transversely oriented to reduce (or substantially eliminate) transverse curvature by way of increasing the bending stiffness of the actuator plate along the transverse axis. In this way, the substantially transversely oriented structural stiffeners reduce or substantially eliminate the amount of transverse curvature that results from the transverse stress component.

The techniques disclosed herein are widely applicable to a variety of approaches for preventing a moment of inertia ("$I_z$"), of an actuator plate, along a longitudinal axis from inadvertently increasing as a result of a drive signal causing transverse curvature of the actuator plate. Numerous aspects of the techniques disclosed herein are described in the specific context of applying transversely oriented structural stiffeners to an underside of one or more actuator plates. These actuator plates may be coupled to and induce angular rotation into a scanning mirror of a microelectromechanical systems (MEMS) scanning device. While the presently disclosed techniques are not necessarily limited to such embodiments, an appreciation of various aspects of the techniques disclosed herein is readily gained through a discussion of examples in this specific context of microelectromechanical systems (MEMS) scanning devices. However, the concepts described herein are applicable to many other scenarios to improve actuatable stroke and/or force in piezo-actuated MEMS devices.

Turning now to FIG. 1, illustrated is an exemplary microelectromechanical systems (MEMS) scanning device 100 (also referred to herein as MEMS scanner) having one or more thin film actuators 102 that are actuatable to cause a scanning mirror 108 to rotate about a rotational axis 110. For example, individual ones of the thin film actuators 102 may have a piezoelectric film (shown in FIG. 3A) deposited over one or more surfaces thereof. For example, the thin film actuators 102 may each include a thin (e.g., three micron "3 µm") layer of lead zirconate titanate (PZT)—a material that shows a marked piezoelectric effect—deposited over a top and/or bottom surface thereof. As described above, activation of the piezoelectric film on an individual thin film actuator 102 causes tensile or compressive mechanical stress (e.g., measured in Pascal "Pa" units of $kg \times m^{-1} \times s^{-2}$) at whichever surface it is deposited, thereby inducing a bending moment (e.g., measured in Newton-meter per width of the beam), within an actuator plate 104. As described above, some component of this mechanical stress results in an amount of longitudinal curvature (i.e., bending around a transverse axis). In the illustrated embodiment, this mode of bending associated with longitudinal curvature is desirable since the achievable amount of longitudinal curvature dictates the achievable amount of actuator stroke. Furthermore, the greater the achievable actuator stroke, the greater the achievable angular rotation of the scanning mirror 108 about the rotational axis 110.

In particular, as illustrated, the scanning mirror 108 is suspended from a frame structure 112 by way of a first torsional beam flexure 114(1) and a second torsional beam flexure 114(2), each of which are mechanically coupled to opposite sides of the scanning mirror 108. In the illustrated embodiment, each of these two torsional beam flexures 114 are mechanically coupled to a pair of the thin film actuators 102. Specifically, as illustrated in FIG. 1, the first torsional beam flexure 114(1) is mechanically coupled to tips of both of a first thin film actuator 102(1) and a second thin film actuator 102(2) by way of lever arms 116 that extend in a transverse direction (i.e., in a direction generally parallel to the transverse axis). Similarly, the second torsional beam flexure 114(2) is mechanically coupled to both of a third thin film actuator 102(3) and a fourth thin film actuator 102(4), also by way of lever arms extending a transverse direction. It will be appreciated by one skilled in the art of MEMS actuator design that the thin film actuators 102 may be coupled to the scanning mirror 108, torsional beam flexures 114, and/or the frame structure 112 by via a layer of silicon film that is common to and continuous between the thin film actuators 102 and these other system components.

With respect to modulating the angular position of the scanning mirror 108, drive signals may be provided to the cause the first thin film actuator 102(1) and the second thin film actuator 102(2) to actuate (e.g., change shape in a controlled manner in which the portion of the actuator plate coupled to the lever arm deflects) in opposite vertical directions thereby inducing a moment of force upon the first torsional beam flexure 114(1). The moment forces generated by each actuator may be in the same direction (e.g., clockwise or counterclockwise) about the rotational axis 110. At the same time, additional drive signals may also be provided to cause the third thin film actuator 102(3) and the fourth thin film actuator 102(4) to actuate in opposite vertical directions to induce an additional moment of force upon the second torsional beam flexure 114(2). These moments of force ultimately result in some degree of torsional deformation being induced into the first torsional beam flexure 114(1) and/or the second torsional beam flexure 114 (2). It will be appreciated that the first thin film actuator 102(1) and the fourth thin film actuator 102(4) may actuate in unison in a first vertical direction whereas the second thin film actuator 102(2) and the third thin film actuator 102(3) may also actuate in unison in a second "opposite" vertical direction.

Since the scanning mirror 108 is suspended from the frame structure 112 via the torsional beam flexures 114, causing torsional deformation to the torsional beam flexures 114 results in some degree of angular rotation of the scanning mirror 108 about the rotational axis 110. Thus, activation of the thin film actuators 102 causes the scanning mirror 108 to rotate about the rotational axis 110 in relation to the frame structure 112. The amount of actuatable deflection of the connection point between the actuator plates 104 and the lever arms 116 corresponds to the effective actuator stroke for the thin film actuators 102. As described above, in some applications it may be desirable to increase this effective actuator stroke. For example, increasing the actuator stroke may increase the range of angles which the MEMS scanning device 100 can actuate the scanning mirror 108 into.

As illustrated in FIG. 1, individual ones of the thin film actuators 102 may have one or more structural stiffeners 118. The structural stiffeners 118 may be essentially transversely oriented in the sense that each stiffener extends substantially parallel to the transverse axis (e.g., "Y") corresponding to the actuator plate 104 from which the structural stiffener 118 protrudes. In this way, the inclusion of the structural stiffeners 118 serves to mitigate (e.g., partially reduce or substantially eliminate) the transverse curvature which occurs as a result of the mechanical stresses caused during activation of the piezoelectric film. In particular, the inclusion of the transversely oriented structural stiffeners 118 as protrusions from the actuator plate 104 increases the moment of inertia ($I_z$), of the actuator plate 104, along the transverse axis corresponding to the actuator plate 104 from which the structural stiffener 118 protrudes. Thus, the transversely oriented structural stiffeners 118 serve as an effective means for reducing the transverse curvature of the actuator plate 104.

In contrast, along a substantial portion of the longitudinal axis (X) corresponding to the actuator plate 104, the inclusion of the transversely oriented structural stiffeners 118 as protrusions from the actuator plate 104 does not significantly increase the moment of inertia ($I_z$) when narrow or having of total width that is small compared to the length of the actuator plate 104. For example, for most of the cross-sections of a thin film actuator 102 which are orthogonal to the longitudinal axis, the structural stiffeners 118 will have no impact on the moment of inertia ($I_z$) of the thin film plate 104 (e.g., the actuator arm) (of course with the exception of those cross-sections which are orthogonal to the longitudinal axis and which intersect one of the structural stiffeners 118). Thus, while serving as an effective means for reducing the transverse curvature, the transversely oriented structural stiffeners 118 do not directly inhibit longitudinal curvature of the actuator plate 104. Furthermore, as described in more detail in relation to FIGS. 4 & 5, the inclusion of the structural stiffeners 118 tends to increase the monoclastic nature in which the thin film actuator 102 bending occurs. This is not to say that the inclusion of the structural stiffeners 118 achieves perfectly monoclastic bending but rather than inclusion of the structural stiffeners 118 increases the amount of longitudinal curvature and/or decreases the amount of transverse curvature. For example, the transverse orientation of the structural stiffeners 118 decreases the degree of transverse curvature caused during activation of the thin film actuator 102, which in turn lessens the amount that a moment of inertia ($I_z$) increases along the longitudinal axis (although a slight increase may still occur) during activation, which in turn increases the achievable tip deflection of the thin film actuator 102.

Figure 2:
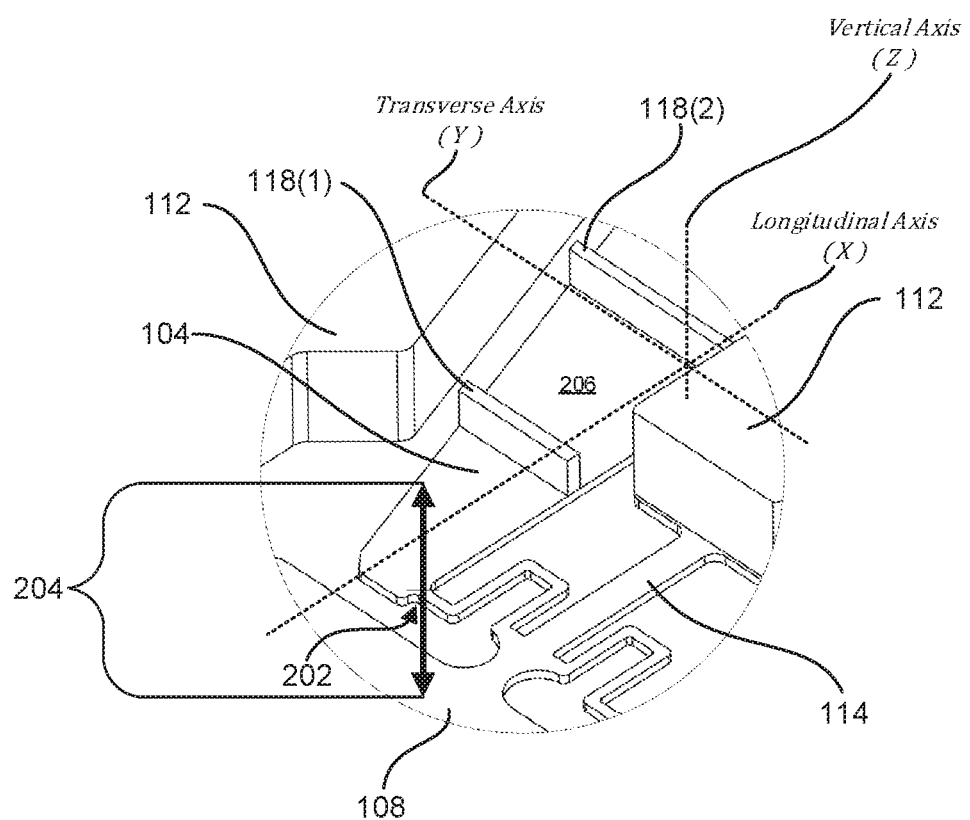
FIG. 2 illustrates a detailed view of the MEMS scanning device showing a tip-portion of an individual thin film actuator.

Turning now to FIG. 2, illustrated is a detailed view of the MEMS scanning device 100 showing a portion 202 of the fourth thin film actuator 102(4). The detailed view shown in FIG. 2 corresponds to Detail A circled in FIG. 1. As illustrated in FIG. 2, the portion 202 of the actuator plate 104 is connected to a flexible lever arm 116 in a manner that indirectly couples the scanning mirror 108 to the fourth thin film actuator 102 (4). An actuatable deflection of this portion 202 of the actuator plate 104 defines an achievable actuator stroke 204. In the illustrated embodiment, the portion 202 of the actuator plate 104 is located at or substantially proximate to a tip of the fourth thin film actuator 102 (4). However, the portion 202 of the actuator plate 104 that controllably deflects to achieve the actuator stroke 204 may be located elsewhere along the longitudinal axis. For example, the portion 202 may be located relatively closer to a base of the actuator plate 104 that is mechanically coupled to the frame structure 112 and from which the actuator plate 104 protrudes.

In the illustrated embodiment, at least a first structural stiffener 118(1) and a second structural stiffener 118(2) protrude from a bottom surface 206 of the actuator plate 104. Furthermore, each of the structural stiffeners 118 are substantially parallel with a transverse axis (Y). As described herein, the inclusion of these structural stiffeners 118 oriented transversely on a surface of an actuator plate 104 of a cantilever type thin film actuator has been determined to significantly increase the achievable tip deflection—which as described herein may directly correspond to actuator stroke 204.

As one specific example, consider a baseline scenario of a thin film actuator that is mechanically affixed to a frame structure at a base having a first width of approximately two millimeters in relation to a transverse axis and that protrudes from the frame structure approximately three and one-half millimeters along a longitudinal axis to a tip having a second width of approximately one-half millimeter. It has been empirically determined that when compared to a baseline stiffener-less embodiment, the inclusion of three transversely oriented structural stiffeners at various distances along the longitudinal axis (e.g., as illustrated in FIGS. 1 and 2) results in a substantial gain (e.g., 1.60 or 60% gain) in achievable tip deflection as a direct result of preventing the moment of inertia ($I_z$) from increasing along the longitudinal axis due to inadvertent/unwanted transverse curvature during activation.

Figure 3A:
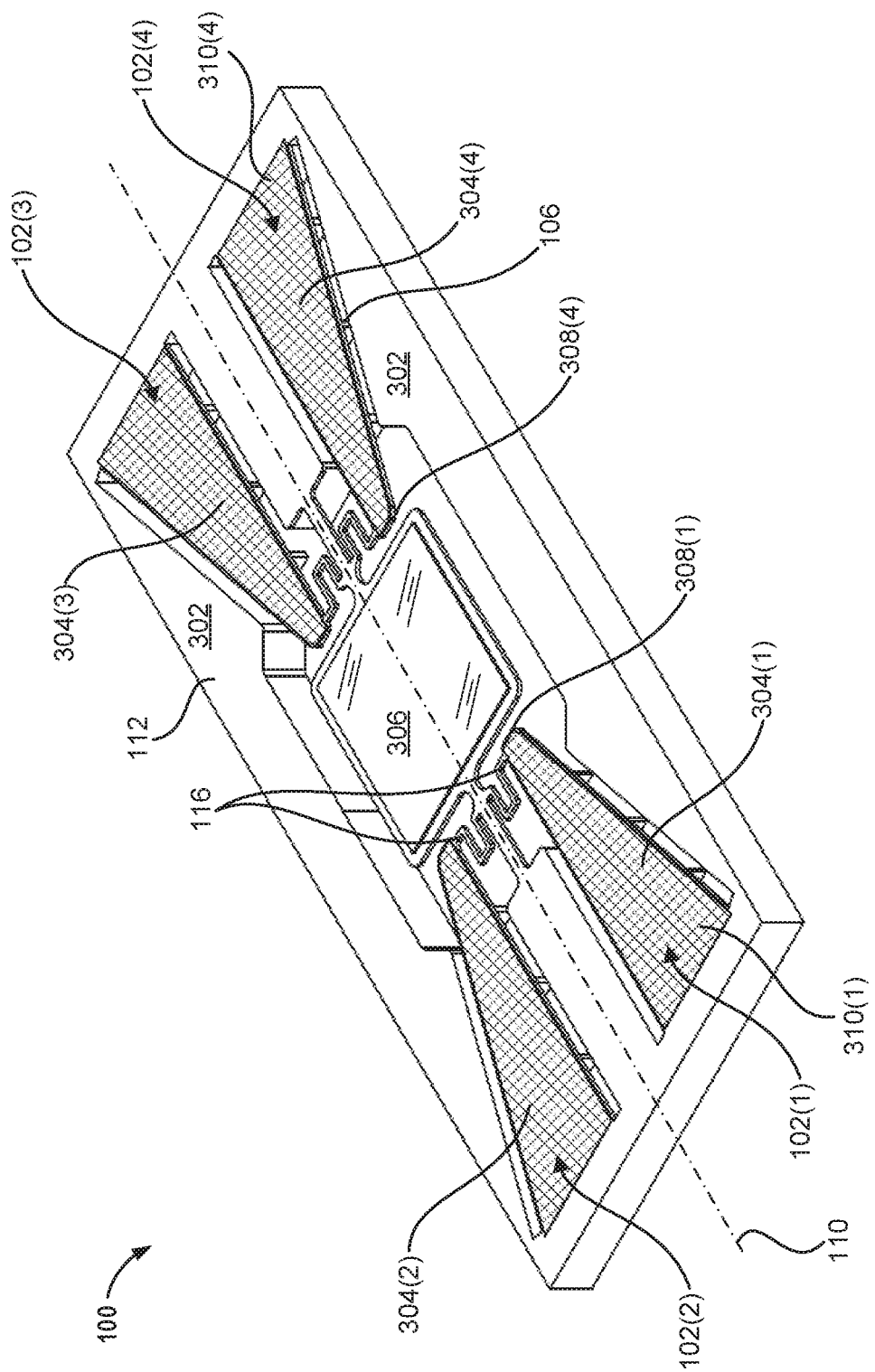
FIG. 3A illustrates the MEMS scanning device in a neutral state in which the thin film actuators are in an equilibrium position.
Figure 3B:
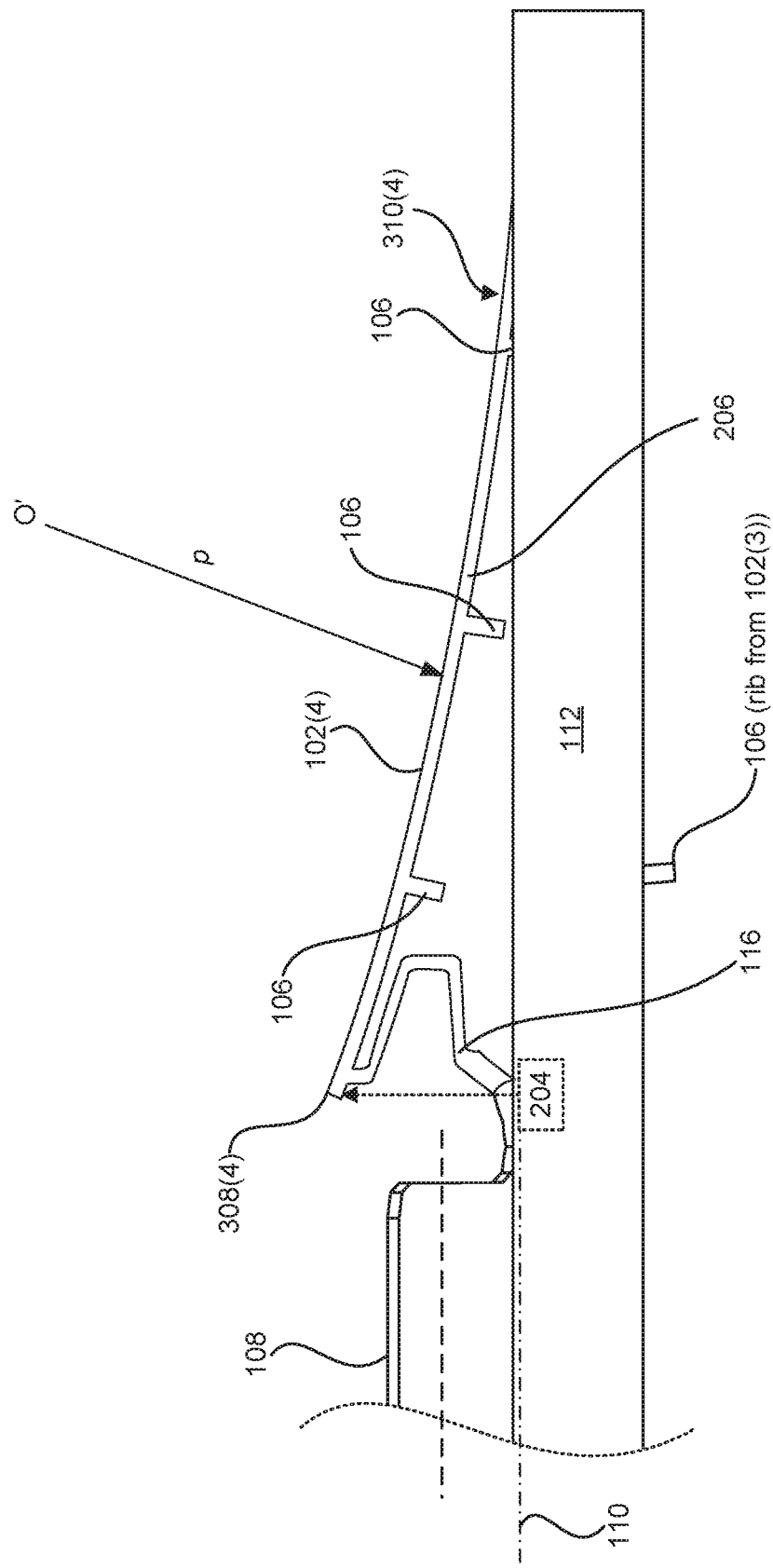
FIG. 3B illustrates a side view of the MEMS scanning device of FIG. 3A in a flexed state in which the thin film actuators have been actuated to induce rotation of a scanning mirror about the rotational axis.

FIGS. 3A and 3B illustrate various flexure states of an exemplary MEMS scanning device 100 in accordance with one or more embodiments described herein. In particular, as described herein, during operation of the MEMS scanning device 100, the thin film actuators 102 induce torsional deformation into the torsional beam flexure 114 to cause rotation of the scanning mirror 108 about the rotational axis 110. The degree or amount of achievable torsional deformation is a direct result of the amount of actuator stoke 204 that is achievable by the thin film actuators 102. Also, the degree or amount of achievable angular rotation of the scanning mirror 108 is a direct result of the amount of achievable torsional deformation.

FIG. 3A illustrates the MEMS scanning device 100 in a neutral state in which the thin film actuators 102 are in an equilibrium position that corresponds to the scanning mirror 108 being substantially parallel or potentially even coplanar with a top surface 302 of the frame structure 112. In the illustrated embodiment, individual ones of the thin film actuators 102 include a corresponding thin film layer of an actuation material 304. As an example, the thin film actuators 102 may each include a thin (e.g., three micron "3 µm") layer of lead zirconate titanate (PZT)—a material that shows a marked piezoelectric effect. For illustrative purposes, the specific region of the thin film actuators 102 that are covered with the actuation material 304 are shown with a hatched pattern. The neutral state illustrated in FIG. 3A may correspond to a resting or equilibrium state in which no drive signal is currently being applied to the actuation material 304 and, therefore, no resulting internal moment is being induced into the thin film actuators 102.

In some embodiments, the each of the thin film actuators 102 include an actuator plate 104 (below the actuation material in FIG. 3A—labeled in FIGS. 1 & 2) that is formed of a selected material that extends continuously throughout one or more of the torsional beam flexures 114, the scanning mirror 108, and the frame structure 112. For example, the scanning mirror 108 may correspond to a portion of a thin (e.g., thirty-five micron "35 µm") plate of Silicon 100 which has some mirrored surface 306 or film deposited thereon, the thin film actuators 102 may correspond to a portion of this thin plate which has a thin (e.g., three micron "3 µm") layer of lead zirconate titanate (PZT) deposited thereon, and the frame structure 112 may correspond to some portion of the thin plate which is overlaid on/coupled to a substantially thicker plate (e.g., four-hundred micron "400 µm") of Silicon 100 to provide frame-like rigidity. In such embodiments, due to the nature of the boundary between the actuator plate 104 and the lever arms 116 being a continuous material, an important design consideration is to provide sufficient mechanical compliance for the tips 308 of the actuator plates 102 during the stroke of the thin film actuators 102 that induces the rotational throw of the scanning mirror 108. In some embodiments, such as illustrated here, this mechanical compliance is accomplished by tapering the actuator plates 104 toward the tips 308. In this way, substantially monoclastic bending may occur toward the base(s) 310 of the thin film actuators 102 whereas towards the tips 308 the actuator plates 104 are compliant and will undergo torsional deformation due to tensile forces from the lever arm 116.

In the illustrated embodiments, the actuator plates are shown to be cantilevered from a substantially rigid frame structure that is of a greater thickness relative to the actuator plates. For example, the frame structure may have a nominal thickness of 450 micrometers whereas the actuator plates may have a nominal thickness of 35 micrometers and the stiffeners a nominal thickness of roughly five times that of the actuator plates. In some embodiments, the actuator plates and the rigid frame structure may have the same nominal thickness. For example, the frame structure may have a nominal thickness of 35 micrometers whereas the actuator plate may also have a nominal thickness of 35 micrometers. In such embodiments, the actuatable portion or arm correspond to or be defined by the region of the continuous material (which makes up both of the rigid frame structure and the actuator plate) that has piezoelectric material deposited thereon.

Turning now to FIG. 3B, illustrated is a side view of the MEMS scanning device 100 in a flexed state in which the thin film actuators 102 have been actuated to induce rotation of the scanning mirror 108 about the rotational axis 110. As shown in FIG. 3B, the fourth thin film actuator 102(4) has been actuated upwards (i.e., raised above the top surface 302 of the frame structure 112) in the sense that longitudinal curvature of some radius p from a center of curvature O' is induced into the actuator. As a result, the fourth thin film actuator 102(4) puts an upward actuation force into the lever arm 116 which transmits this force into the torsional beam flexure 114 (hidden behind the frame structure 112) as a torque. As there are four thin film actuators 102 in the MEMS scanning device 100, each of these actuators may be actuated in unison to cause the scanning mirror 108 to rotate about the rotational axis 110. It will be appreciated by one skilled in the art of MEMS scanner design that during operation drive signals may be continually applied and adjusted to cause the scanning mirror 108 to drive at desired a waveform and frequency, or held to point at a desired angle between a positive displacement angle ($\phi$) and a negative displacement angle ($\phi$).

Figure 4A:
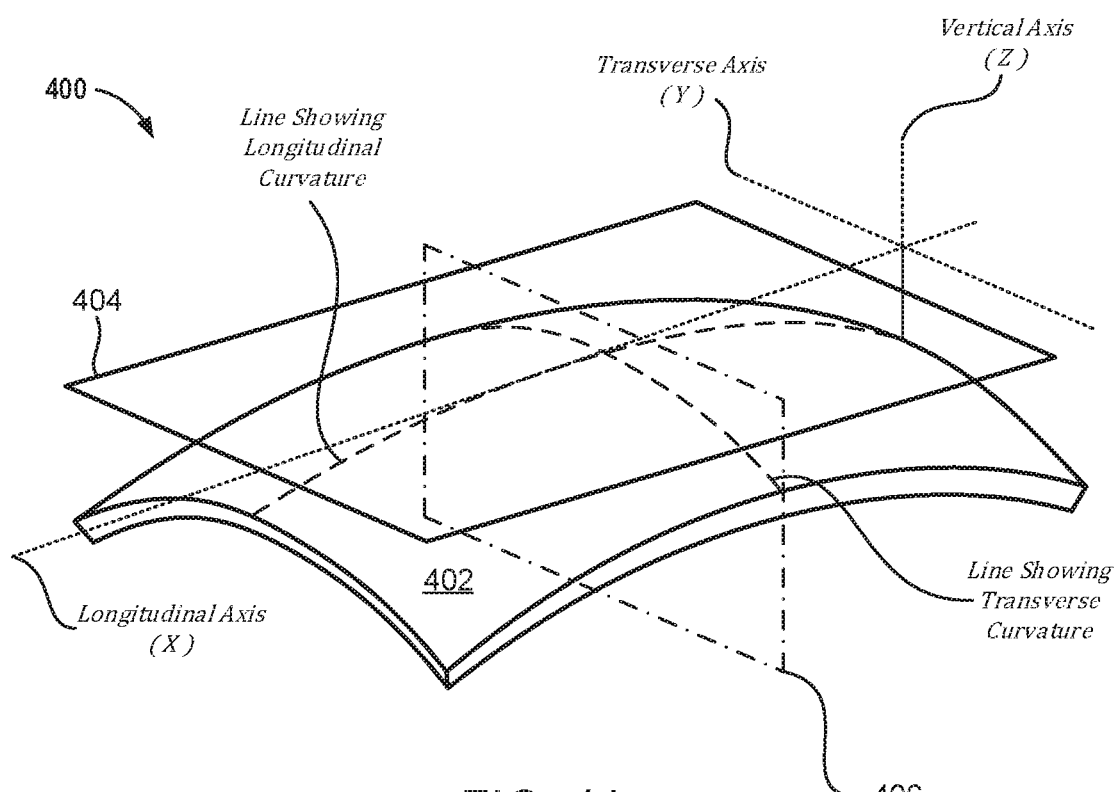
FIG. 4A illustrates a thin film actuator in a state of synclastic (e.g., bidirectional) bending as a result of a stress being applied to a surface of the thin film actuator via activation of an actuation material that is deposited on the surface.

Turning now to FIG. 4A, illustrated is a thin film actuator 400 in a state of synclastic bending as a result of a stress being applied to surface 402 via activation of an actuation material (e.g., PZT) deposited on the surface 402. As illustrated, the state of synclastic bending can be characterized by the principal curvatures of the surface 402 having the same sign or even magnitude. In other words, the centers of curvature for both the line showing longitudinal curvature and the line showing transverse curvature are on the same side of the surface 402 (i.e., below the surface in the state of bending shown in FIG. 4). As used herein, the term "synclastic bending" refers to a bending mode in which a curved surface is characterized by bending in two directions at any given moment in time and in which each direction of bending is away from the initial neutral plane 404. As illustrated, the initial plane 404 may be defined by the transverse axis (Y) and longitudinal axis (X) of the thin film actuator 400.

With respect to transverse curvature hampering performance of the thin film actuator 400, suppose that the thin film actuator 400 is deployed in scenario in which maximum longitudinal curvature is desired. Under these circumstances, increases to the moment of inertia ($I_z$) of the thin film actuator 400 along the longitudinal axis may be hamper the desired maximization of the longitudinal curvature. This is because transverse curvature tends to increase the moment of inertia ($I_z$) of the thin film actuator 400 at various cross sections taken along the longitudinal axis (and which are orthogonal to the longitudinal axis). Thus, the transverse curvature shown in FIG. 4 may hinder the performance of the thin film actuator 400.

Figure 4B:
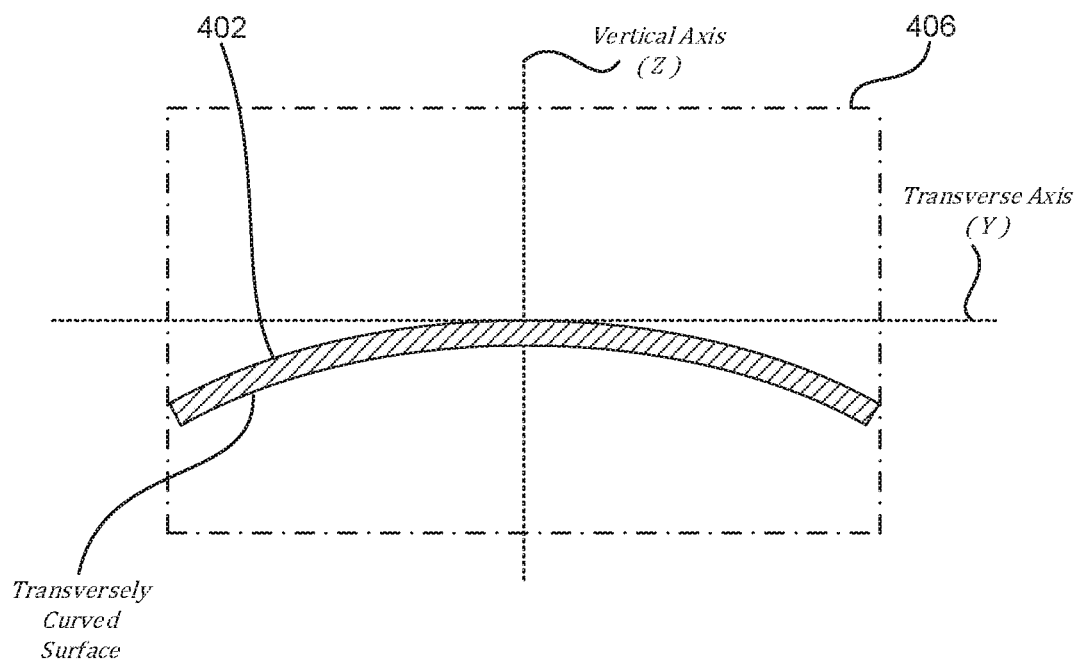
FIG. 4B illustrates an exemplary cross section of the thin film actuator taken at a cut-plane that is orthogonal to the longitudinal axis.

Turning now to FIG. 4B, illustrated is an exemplary cross section of the thin film actuator 400 taken at a cut-plane 406. At this illustrated cross section, the moment of inertia ($I_z$) of the actuator plate will tend to increase with increased transverse curvatures. Furthermore, the moment of inertia ($I_z$), computed about a corresponding neutral axis, for any given cross sectional area taken along the longitudinal axis can be determined based on equation 1 as follows:

$$I_z = \int_z z^2 dA \qquad \text{Equation 1}$$

To address this issue of bending in one direction hampering (e.g., lessening) actuator stroke that results from bending in another direction, an object of the presently disclosed techniques is to provide a thin film actuator that is highly resistant to one mode/direction of bending while being suitably compliance/flexible to bending in another mode/direction of bending.

Figure 5A:
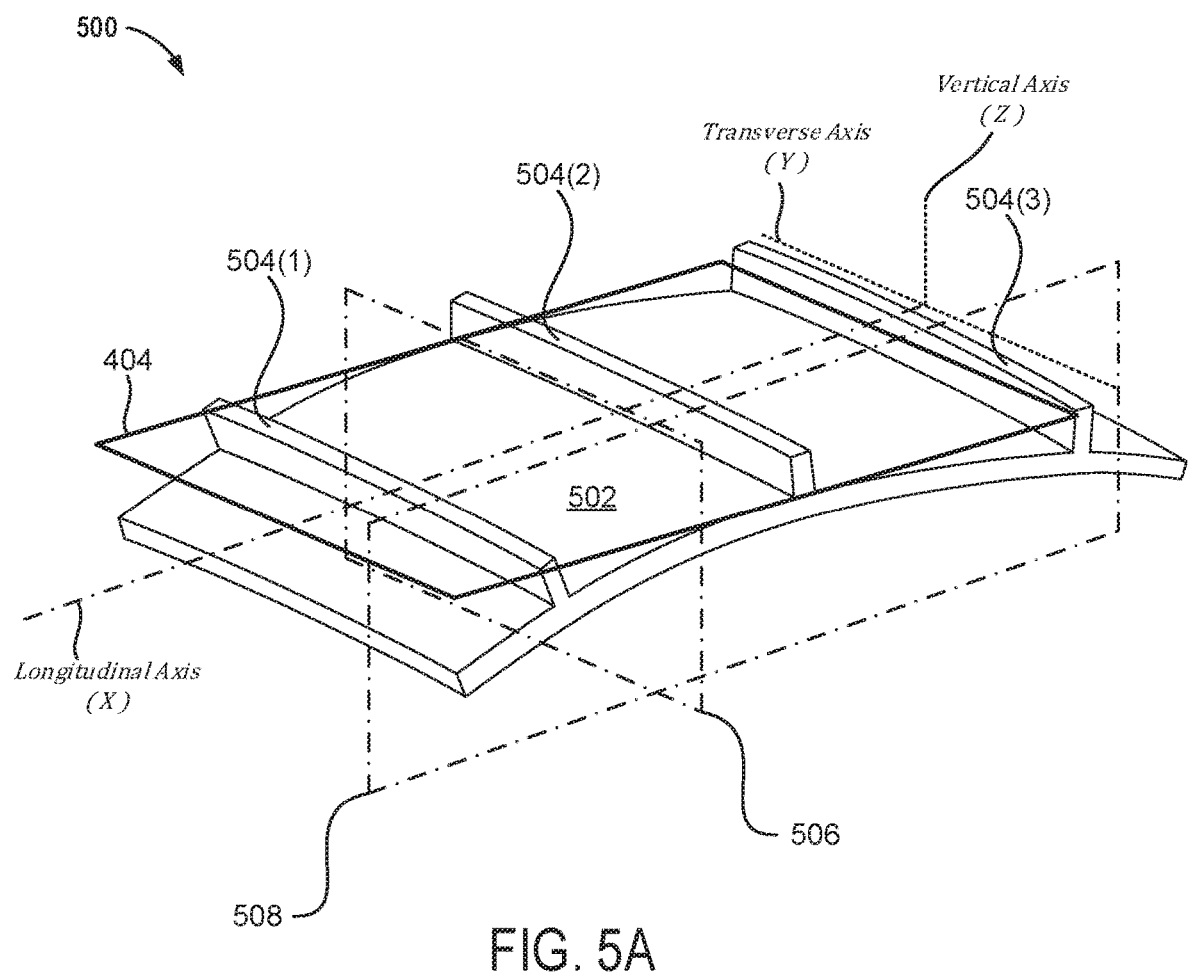
FIG. 5A illustrates a thin film actuator that includes transversely oriented structural stiffeners that cause the thin film actuator to bend in relatively more monoclastic (e.g., unidirectional) nature than as shown in FIG. 4 as a result of a stress that is similar to that applied to the thin film actuator of FIG. 4.

Turning now to FIG. 5A, illustrated is a thin film actuator 500 that includes transversely oriented structural stiffeners 504 and that is in a state of "substantially" monoclastic bending as a result of a stress that is similar to that applied in FIG. 4. As illustrated, the state of monoclastic bending can be characterized by the relative amount of bending in one direction being substantially greater than the amount of bending in another perpendicular direction. It will be appreciated that in the illustrated embodiment, the amount of bending associated with longitudinal curvature is substantially greater than the amount of bending associated with transverse curvature. Thus, the state of bending illustrated in FIG. 5 may be aptly described as a state of "substantially" (albeit not "perfectly") monoclastic bending.

Figure 5B:
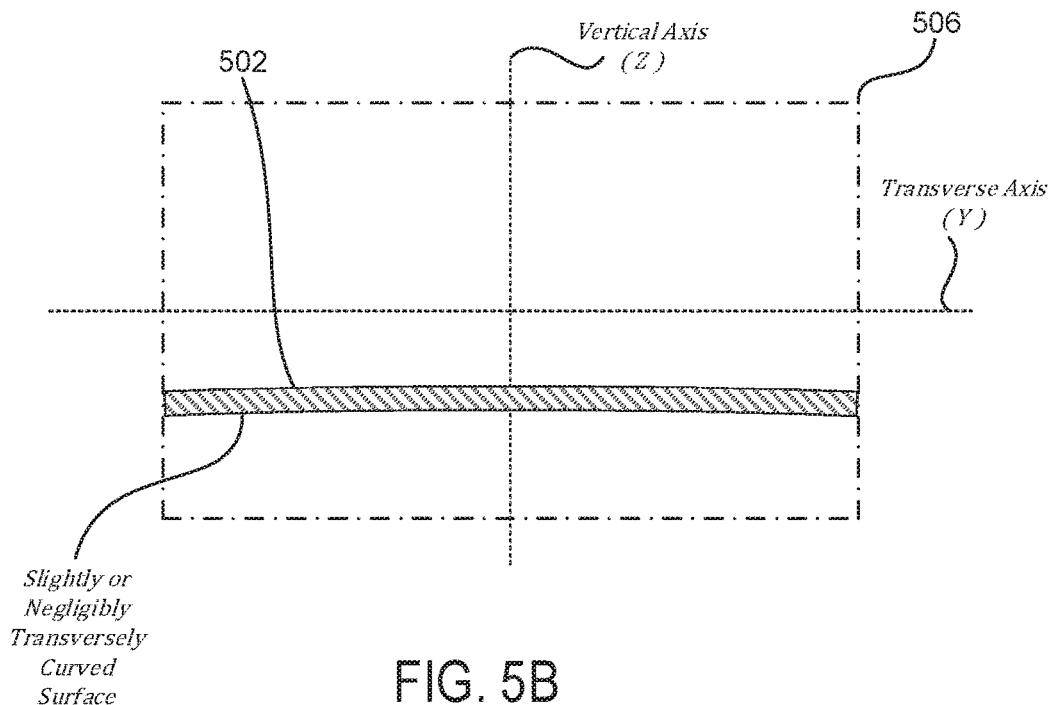
FIG. 5B illustrates an exemplary cross section of the thin film actuator of FIG. 5A taken along a cut-plane that is orthogonal to the longitudinal axis and does not intersect any of the transversely oriented structural stiffeners.

Turning now to FIG. 5B, illustrated is an exemplary cross section of the thin film actuator 500 that includes transversely oriented structural stiffeners 504. The cross section of FIG. 5B is taken at a cut-plane 506. As this particular cross section does not fall directly on one of the transversely oriented structural stiffeners 504, these stiffeners will not impact the moment of inertia ($I_z$). Furthermore, since only a relatively small number of cross section taken at equal intervals along the longitudinal axis will fall directly on a transversely oriented structural stiffener 504, these stiffeners will not severely increase the bending stiffness along the longitudinal axis.

Figure 5C:
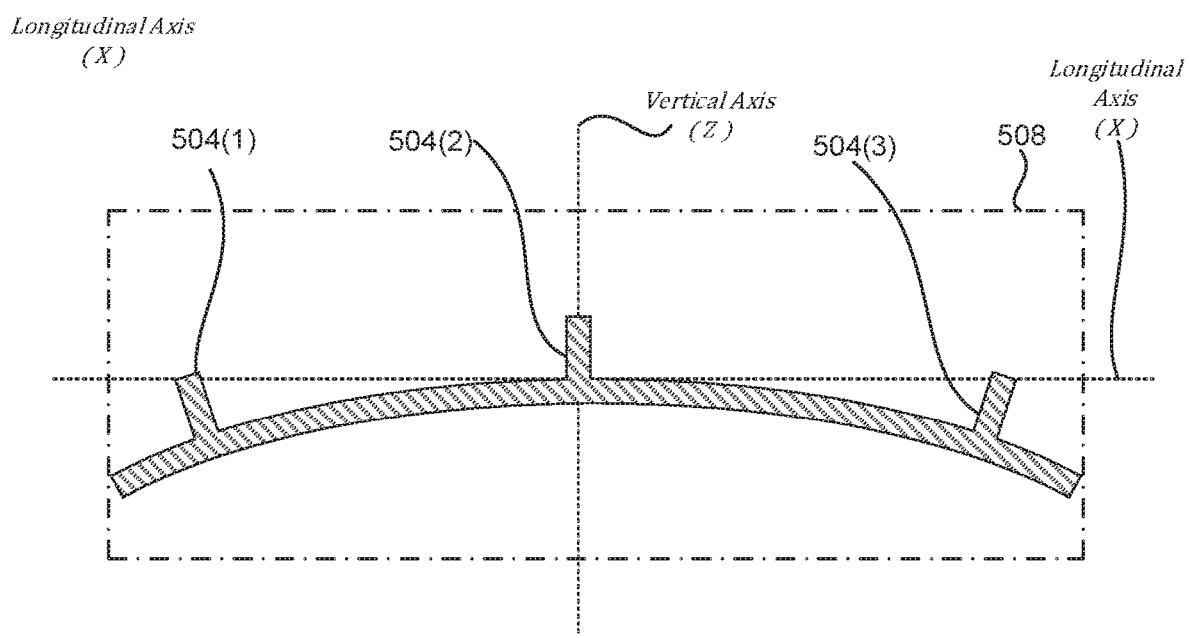
FIG. 5C illustrates an exemplary cross section of the thin film actuator of FIG. 5A taken along a cut-plane that is orthogonal to the transverse axis and intersects the transversely oriented structural stiffeners.

Turning now to FIG. 5C, illustrated is an exemplary cross section of the thin film actuator 500 taken at a cut-plane 508. As illustrated, cross-sections that are taken along the transverse (longitudinal?) axis will intersect the transversely oriented structural stiffeners 504 in a manner that increases the moment of inertia ($I_z$) along the transverse axis and, therefore, reduces the transverse curvature as compared to the thin film actuator 400 which does not include the transversely oriented structural stiffeners. Thus, a visual comparison of FIG. 5B to FIG. 4B reveals that the relative amount of transverse curvature is less in the actuator 500 vs the actuator 400 due to the stiffeners 504. This reduction in transverse bending serves to prevent the bending stiffness along the longitudinal axis from increasing and, therefore, serves to increase actuator stroke.

Figure 6A:
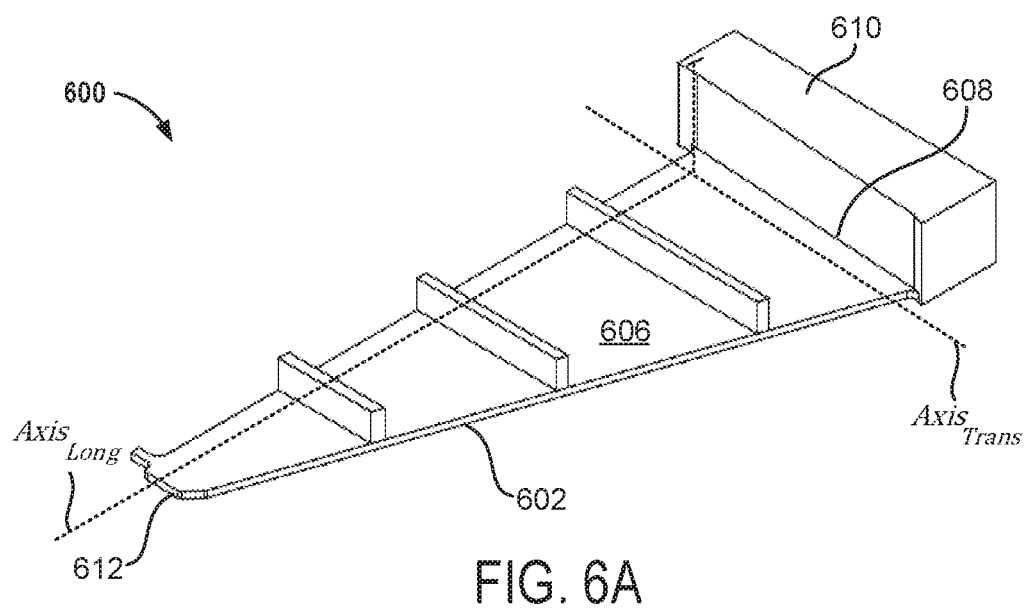
FIG. 6A illustrates an isometric view of an exemplary microelectromechanical systems (MEMS) actuation device.

Referring now specifically to FIG. 6A, illustrated is an isometric view of an exemplary microelectromechanical systems (MEMS) actuation device 600. As illustrated, the MEMS actuation device 600 includes an actuator plate 602 and a plurality of structural stiffeners 604 protruding from a first surface 606 of the actuator plate 602. In the illustrated embodiment, the MEMS actuation device 600 includes three individual structural stiffeners 604, each of which are substantially perpendicular to a linear longitudinal axis $Axis_{Long}$ that extends from a base 608, of the actuator plate 602, that is coupled to a frame structure 610 to a tip 612 of the actuator plate 602.

Figure 6B:
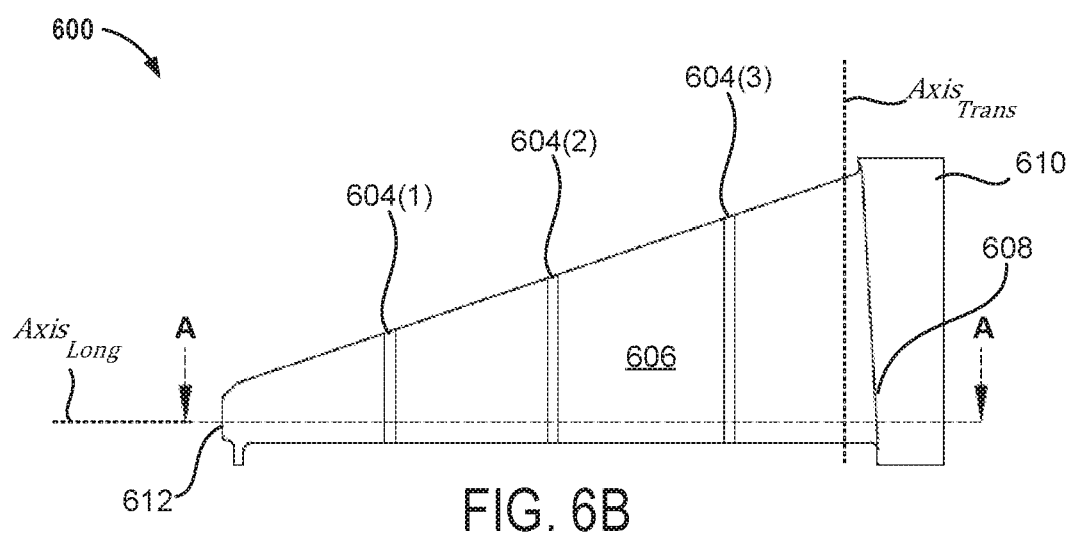
FIG. 6B illustrates a top view of the MEMS actuation device of FIG. 6A.
Figure 6C:
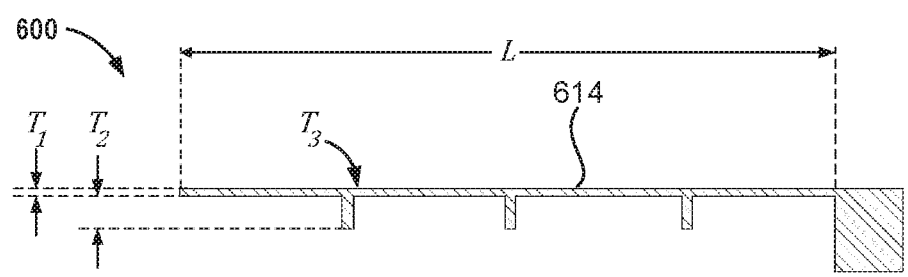
FIG. 6C illustrates a cross-section view of the MEMS actuation device of FIGS. 6A and 6B taken along the line A-A of FIG. 6B.

FIG. 6B illustrates a top view of the MEMS actuation device of FIG. 6A. FIG. 6C illustrates a cross-section view of the MEMS actuation device of FIGS. 6A and 6B taken along the line A-A of FIG. 6B. As shown in FIG. 6C, the MEMS actuation device 600 includes an actuation material 614 such as, for example, a piezoelectric film on a side that is opposite the side from which the structural stiffeners 604 protrude.

As illustrated in FIGS. 6A and 6B, the longitudinal axis is illustrated as being substantially parallel to and slightly offset from a side of the actuator plate 602 whereas the transverse axis is illustrated as being located perfectly orthogonal to the longitudinal axis. However, other orientations and/or locations for the longitudinal axis are contemplated and within the scope of the present disclosure. For example, in some embodiments, the longitudinal axis may be defined as being parallel to either side of the actuator plate 602. As another example, in some embodiments, the longitudinal axis may be defined as being substantially orthogonal to the cantilever support. As another example, in some embodiments, the longitudinal axis may be defined as being substantially co-linear with a midline of the actuator plate 602. As another example, in some embodiments, the longitudinal axis may be defined as being substantially orthogonal to the cantilever support.

With particular reference to FIG. 6C, the actuator plate 602 may have a first nominal thickness $T_1$ whereas the structural stiffeners 604 may protrude some second nominal thickness $T_2$ from the actuator plate 602. Furthermore, the actuation material 614 may have a third nominal thickness $T_3$ (note: as the third nominal thickness $T_3$ may be relatively small in scale as compared to the first and second nominal thicknesses, the third thickness $T_3$ is not graphically represented in FIG. 6C) which may be different than one or both of the first and second nominal thicknesses.

In some embodiments, the first nominal thickness $T_1$ of the actuator plate may be at least five times greater than the third nominal thickness $T_3$ and the second nominal thickness $T_2$ may be at least twenty times greater than the third nominal thickness $T_3$. For example, in a specific embodiment, the first nominal thickness $T_1$ of the actuator plate may be thirty-five micrometers (35 μm) whereas the third nominal thickness $T_3$ may be less than five micrometers (5 μm) whereas the second nominal thickness $T_2$ may be greater than one-hundred and forty micrometers (140 μm). In some embodiments, the MEMS actuation device 600 may extend a length L that is greater than eighty times the first nominal thickness $T_1$ of the actuator plate 602. That is, the MEMS actuation device 600 may have an aspect ratio of 1/80 or even greater. In some embodiments, the MEMS actuation device 600 may extend a length L that is greater than fifty times the first nominal thickness $T_1$ of the actuator plate 602. That is, the MEMS actuation device 600 may have an aspect ratio of 1/50 or even greater. In some embodiments, the MEMS actuation device 600 may extend a length L that is greater than one-thousand times the first nominal thickness $T_1$ of the actuator plate 602. That is, the MEMS actuation device 600 may have an aspect ratio of 1/1000 or even greater. In some embodiments, the MEMS actuation device 600 may extend a length L that is greater than ten times the first nominal thickness $T_1$ of the actuator plate 602. That is, the MEMS actuation device 600 may have an aspect ratio of 1/10 or even greater.

Figure 7A:
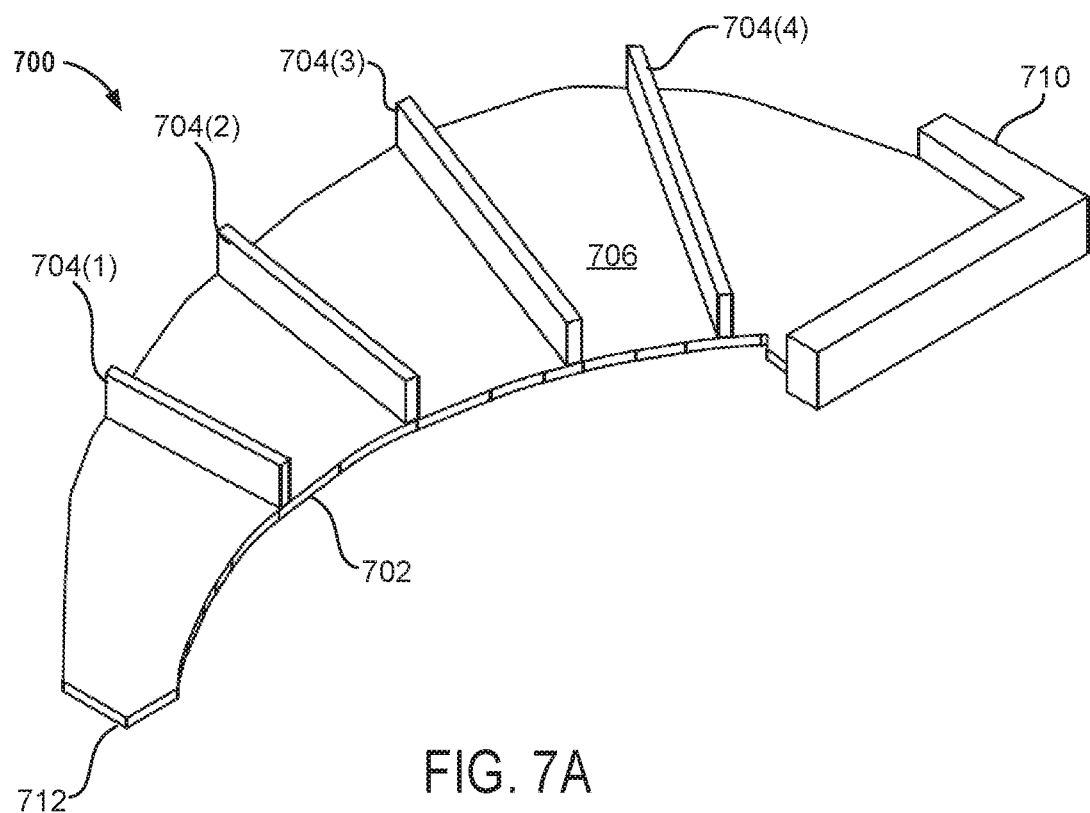
FIG. 7A illustrates an isometric view of an alternate embodiment of an exemplary microelectromechanical systems (MEMS) actuation device that has a non-linear longitudinal axis.
Figure 7B:
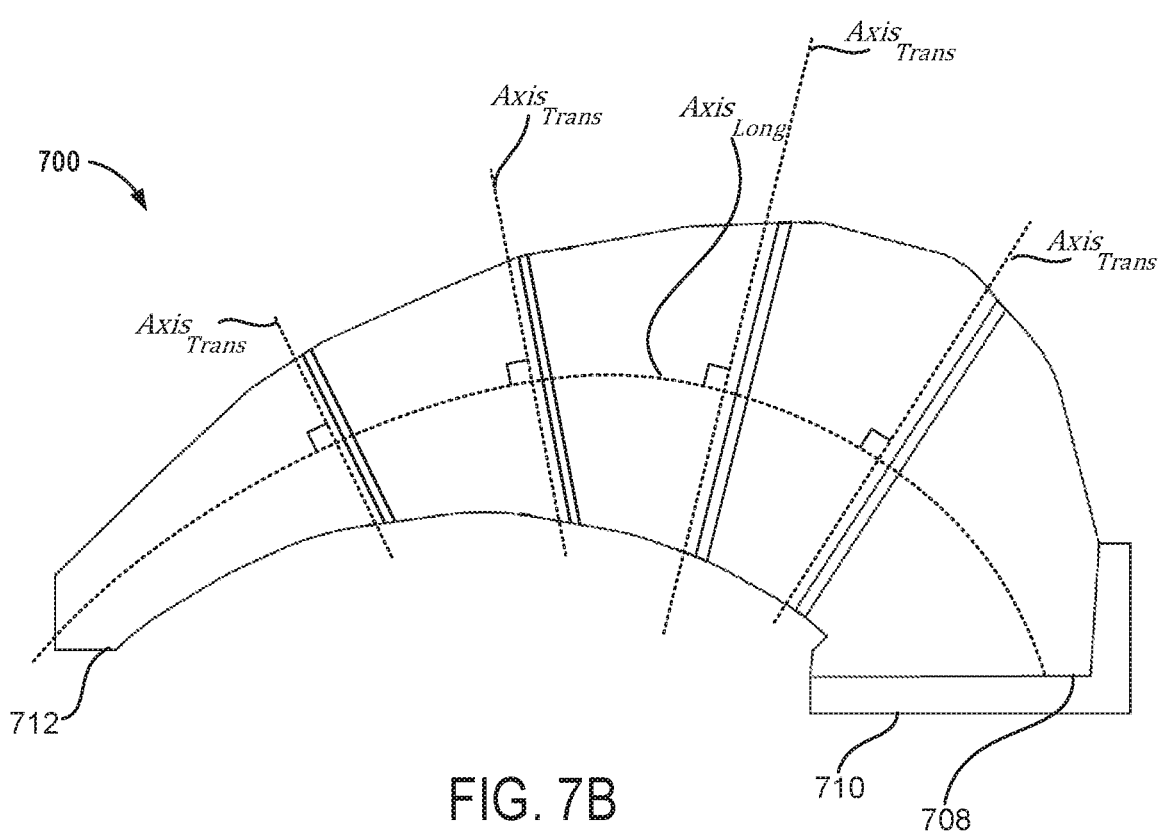
FIG. 7B illustrates a top view of the MEMS actuation device of FIG. 7A.

Referring now specifically to FIG. 7A, illustrated is an isometric view of an alternate embodiment of an exemplary microelectromechanical systems (MEMS) actuation device 700. As illustrated, the MEMS actuation device 700 includes an actuator plate 702 and a plurality of structural stiffeners 704 protruding from a first surface 706 of the actuator plate 702. FIG. 7B illustrates a top view of the MEMS actuation device 700 of FIG. 7A. As shown in FIG. 7B, the MEMS actuation device 700 includes four individual structural stiffeners 704, each of intersect some portion of a curved longitudinal axis $Axis_{Long}$ that extends from a base 708, of the actuator plate 702, that is coupled to a frame structure 710 to a tip 712 of the actuator plate 702. In some embodiments, each of the individual structural stiffeners 704 are substantially parallel with a transverse axis $Axis_{Trans}$ corresponding to the point at which that individual structural stiffener intersects the curved longitudinal axis $Axis_{Long}$.

Figure 8:
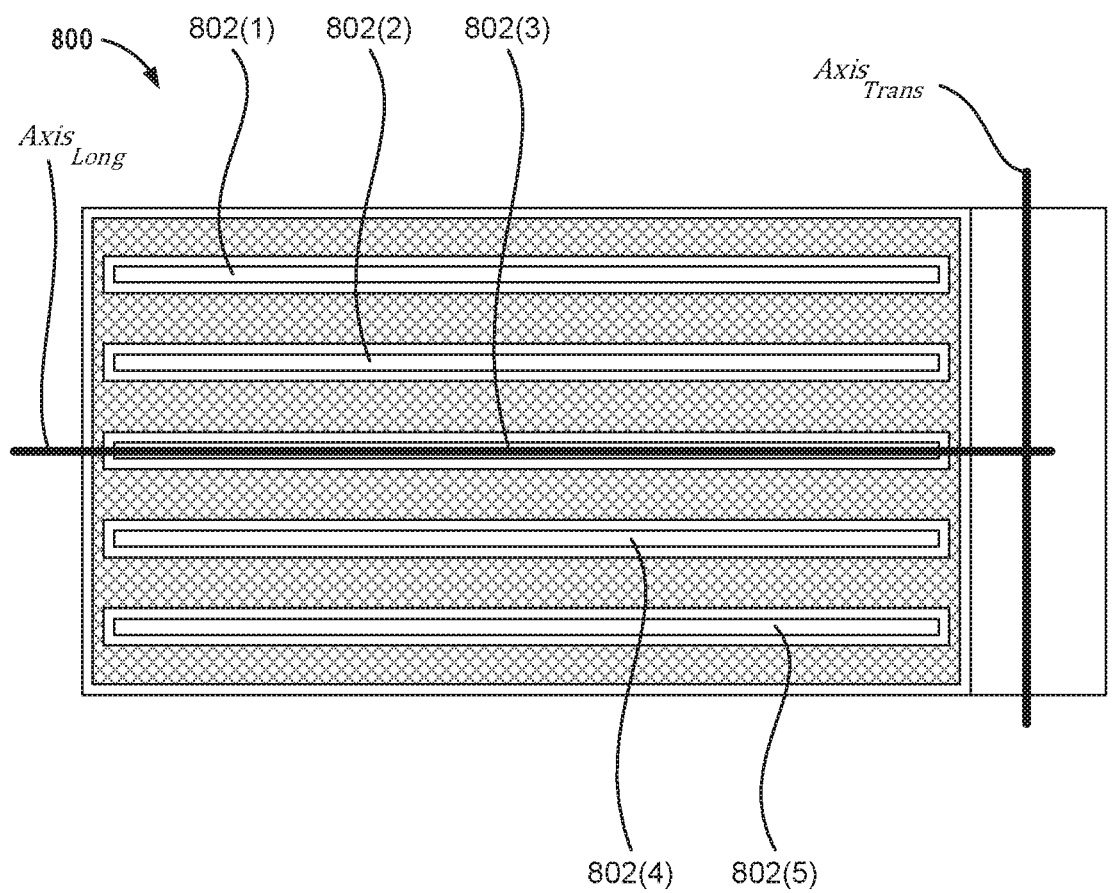
FIG. 8 illustrates an alternative embodiment of an exemplary microelectromechanical systems (MEMS) actuation device.

Turning now to FIG. 8, illustrated is an alternative embodiment of an exemplary microelectromechanical systems (MEMS) actuation device 800. In the embodiment illustrated in FIG. 8, an alternative means for preventing the unwanted longitudinal stiffening to occur as a result of transverse curvature. Specifically, rather than including structural stiffeners to prevent transverse curvature, the MEMS actuation device 800 includes one or more cutouts 802 within the actuator plate 804. The cutouts 802 effectively split the actuator into two or more narrow arms which bend longitudinally. The curvature along the transverse axis is smaller than without the cutouts 802. The reduced curvature along the transverse axis effectively lessens the degree of increase to the area moment of inertia that results from actuation. In FIG. 8, a hatched pattern on the actuator plate 804 represents a thin piezoelectric actuation material.

Figure 9:
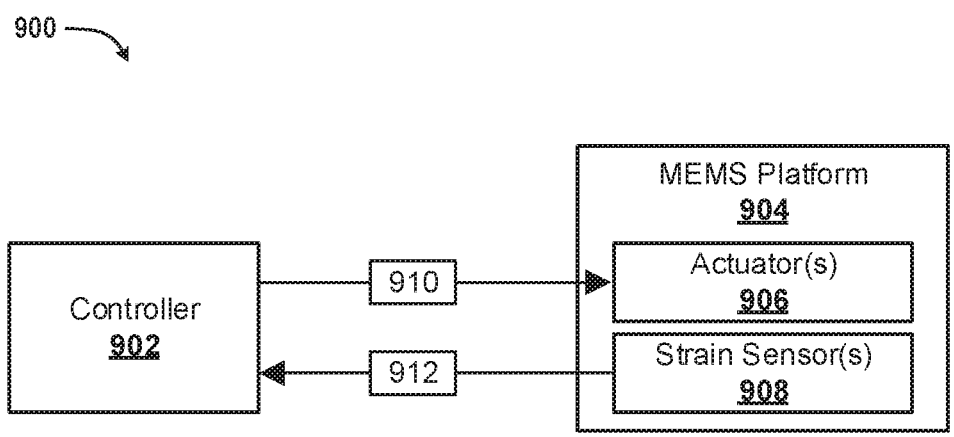
FIG. 9 illustrates a block diagram of an exemplary control system for a microelectromechanical system (MEMS) component that includes one or more actuators having various geometric details (e.g., structural stiffeners) as described herein.

Turning now to FIG. 9, illustrated is a block diagram of an exemplary control system 900 for a microelectromechanical system (MEMS) 904 that includes one or more actuators 906 having various geometric details (e.g., structural stiffeners) as described herein. As illustrated in FIG. 9, the control system 900 may include a controller 902 that provides drive signals 910 to one or more actuators 906 as described herein. The actuators 906 may be configured to controllably move various components of the MEMS 904. As further illustrated, the control system 900 further includes strain sensors 908 that detect certain modes of mechanical strain within the MEMS 904 and, in response thereto, provide a feedback signal 912 to the controller 902. An exemplary strain sensor 908 may comprise a piezoresistive (PZR) sensor that transduces mechanical movement of a specific portion of the MEMS 904 into an electrical signal to generate the feedback signal 912. In various embodiments, the MEMS 904 may be a component of a scanned beam display system as shown and described with respect to FIG. 10, below. However, the MEMS 904 may be any type of MEMS device that operates electromechanically in response to a drive signal 910 while returning a feedback signal 912 to facilitate periodic and/or continual refinement of the drive signal 910.

Figure 10:
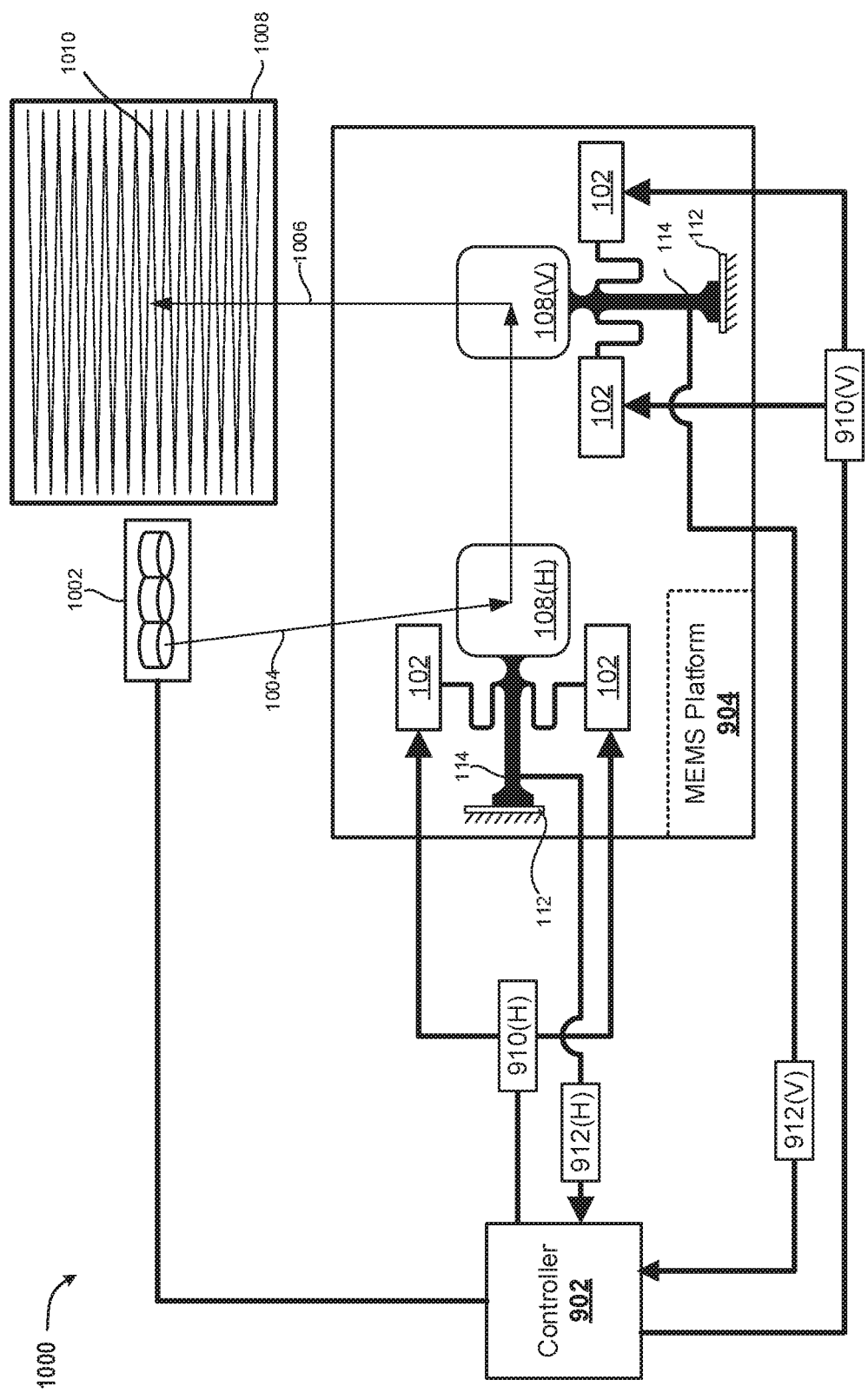
FIG. 10 illustrates an exemplary scanned beam display system in which various embodiments of the thin film actuators described herein may be deployed.

Turning now to FIG. 10, illustrated is an exemplary scanned beam display system 1000 in which various embodiments of the thin film actuators described herein may be deployed. As illustrated, the scanned beam display system 1000 may comprises a light engine 1002 which may include one or more light sources capable of emitting one or more beams 1004 of light toward one or more scanning mirrors 108. In some embodiments, the light engine 1002 includes multiple light sources that are individually capable of emitting light of a particular wavelength and/or within a particular range of wavelengths. As illustrated, the beam(s) 1004 of light are incident on the MEMS 904 and reflects on the one or more scanning mirrors 108. In the specifically illustrated but nonlimiting scenario, the MEMS 904 includes a horizontal scanning mirror 108 (H) and a vertical scanning mirror 108(V). As illustrated, the beam(s) 1004 are initially incident on the horizonal scanning mirror 108(H) and then the vertical scanning mirror 108(V) and then are ultimately as a controlled output beam 1006 that is directed toward a display 1008. In one or more alternative embodiments, the beam(s) 1004 may initially be incident on the vertical scanning mirror 108 (V), then reflected to the horizontal scanning mirror 108 (H), and finally toward the display 1008 in the form of the controlled output beam 1006. In one or more alternate embodiments, a single scanning mirror 108 may scan the beam(s) 1004 in both the horizonal and vertical directions.

In the illustrated embodiment, a horizontal drive signal 910(H) drives one or more actuators 102 whereas a vertical drive signal 910(V) drives one or more actuators 102, which may be different than those actuators 102 driven by the horizontal drive signal 910(H). Thus, by suppling the horizonal drive signal 910(H) and the vertical drive signal 910(V), the controller 902 causes the MEMS 904 to deflect the scanning mirror(s) 108 to cause output beam 1006 to generate a biaxial scan 1010, thereby creating a displayed image via the display 1008. For example, the controller 902 may convert pixel information of an input image into laser modulation synchronous to the motion of MEMS 904 to write the image information as a displayed image based upon the position of the output beam 1006 in a raster pattern and the corresponding intensity and/or color information at the corresponding pixel in the image.

Controller 902 may also control other various functions of scanned beam display system 1000. In one or more embodiments, a horizontal axis may refer to the horizontal direction of biaxial scan 1010 and the vertical axis may refer to the vertical direction of biaxial scan 1010. Scanning mirror(s) 108 may sweep the output beam 1006 horizontally at a relatively higher frequency and also vertically at a relatively lower frequency and with a constant velocity over a portion of the scan. The result is a scanned trajectory of laser beam 1006 to result in biaxial scan 1010. The fast and slow axes may also be interchanged such that the fast scan is in the vertical direction and the slow scan is in the horizontal direction. However, the scope of the claimed subject matter is not limited in these respects.

In some embodiments, the scanned beam display system 1000 may be a component of a Near-Eye-Display device for implementing augmented reality (AR)/(MR, Mixed Reality) technologies to generate composite views that include computer-generated images superimposed over a real-world view. In such embodiments, the display 1008 may be a transparent display panel such as, for example, a waveguide display that includes one or more diffractive optical elements (DOEs) for in-coupling incident light into the waveguide, expanding the incident light in one or more directions for exit pupil expansion, and/or out-coupling the incident light out of the waveguide (e.g., toward a user's eye).

In the foregoing Summary and/or Detailed Description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail. Furthermore, the terms coupled and/or connected, along with their derivatives, may be used throughout this disclosure. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. One or more of "on," "overlying," and "over" may be used to indicate that two or more elements are in direct physical contact with each other. However, "on," "overlying," and/or "over" may also describe a locational relationship between two or more elements that are not in direct contact with each other. For example, "over" may mean that one element is above another element but not necessarily in direct contact with that other element (e.g., another element or elements may be in between the two elements).

Example Clauses

The disclosure presented herein may be considered in view of the following clauses.

Example Clause 1, a microelectromechanical system (MEMS) actuation device, comprising: an actuator plate having a base that is mechanically coupled to a frame structure, wherein the actuator plate protrudes from the frame structure along a longitudinal axis that extends from the base of the actuator plate to a tip of the actuator plate; a piezoelectric film deposited on a first surface of the actuator plate, wherein activation of the piezoelectric film, via a drive signal, applies a bending moment to the actuator plate that causes: transverse curvature, of the actuator plate, along a transverse axis, and longitudinal curvature of the actuator plate, along the longitudinal axis; and a plurality of structural stiffeners protruding from at least one of the first surface of the actuator plate or a second surface of the actuator plate that is opposite the first surface, wherein individual structural stiffeners are aligned substantially parallel to the transverse axis to increase a moment of inertia that resists the transverse curvature.

Example Clause 2, the MEMS actuation device of Example Clause 1, wherein the piezoelectric film has a first nominal thickness and the actuator plate has a second nominal thickness that is at least three times greater than the first nominal thickness, and wherein individual structural stiffeners protrude a distance of at least three times the second nominal thickness.

Example Clause 3, the MEMS actuation device of any one of Example Clause 1 through 2, wherein the plurality of structural stiffeners protrude from the second surface of the actuator plate a distance that is at least twenty times a nominal thickness of the piezoelectric film.

Example Clause 4, the MEMS actuation device of any one of Example Clause 1 through 3, wherein the plurality of structural stiffeners includes at least three individual stiffeners that protrude from the actuator plate a distance that is at least three times a nominal thickness of the actuator plate.

Example Clause 5, the MEMS actuation device of any one of Example Clause 1 through 4, wherein the nominal thickness of the actuator plate is at least five times greater than a nominal thickness of the piezoelectric film.

Example Clause 6, the MEMS actuation device of any one of Example Clause 1 through 5, wherein the longitudinal curvature, of the actuator plate about the transverse axis with which the individual structural stiffeners are aligned substantially parallel to, produces an actuator stroke that corresponds to a deflection of the tip of the actuator plate.

Example Clause 7, the MEMS actuation device of any one of Example Clause 1 through 6, wherein the plurality of structural stiffeners protrudes from the second surface of the actuator plate that is opposite the first surface on which the piezoelectric film is deposited.

Example Clause 8, the MEMS actuation device of any one of Example Clause 1 through 7, wherein the piezoelectric film is lead zirconate titanate (PZT).

Example Clause 9, the MEMS actuation device of any one of Example Clause 1 through 8, wherein a length from the base of the actuator plate to the tip of the actuator plate is at least fifty times a nominal thickness of the actuator plate, and wherein the structural stiffeners protrude from the actuator plate a distance that is at least three times the nominal thickness of the actuator plate.

Example Clause 10, an actuation device, comprising: an actuator plate that protrudes from a frame structure along a longitudinal axis that extends from a base of the actuator plate to a tip of the actuator plate, wherein the actuator plate has a nominal thickness; a piezoelectric film that, upon activation via a drive signal, causes a combination of: transverse curvature, of the actuator plate, along a transverse axis, and longitudinal curvature, of the actuator plate, along the longitudinal axis; and one or more transversely oriented structural stiffeners that are aligned substantially orthogonal to the longitudinal axis resist transverse curvature, of the actuator plate during the activation of the piezoelectric film, thereby at least partially mitigating increases to an area moment of inertia of the actuation device along the longitudinal axis, wherein individual transversely oriented structural stiffeners have a nominal height that is greater than the nominal thickness of the actuator plate.

Example Clause 11, the actuation device of Example Clause 10, wherein the nominal height of the individual transversely oriented structural stiffeners is at least three times greater than the nominal thickness of the actuator plate.

Example Clause 12, the actuation device of any one of Example Clause 10 though 11, wherein the individual transversely oriented structural stiffeners protrude from a first surface of the actuator plate that is opposite a second surface, of the actuator plate, on which the piezoelectric film is disposed.

Example Clause 13, the actuation device of any one of Example Clause 10 through 12, wherein the nominal height that the individual transversely oriented structural stiffeners protrude from the first surface is at least twenty times greater than a nominal thickness of the piezoelectric film on the second surface.

Example Clause 14, the actuation device of any one of Example Clause 10 through 13, wherein the transverse bending produces an actuator stroke that corresponds to a deflection of the tip of the actuator plate.

Example Clause 15, the actuation device of any one of Example Clause 10 through 14, wherein the longitudinal axis extends linearly from the base of the actuator plate to the tip of the actuator plate.

Example Clause 16, the actuation device of any one of Example Clause 10 through 15, wherein the longitudinal axis is a curved axis that extends non-linearly from the base of the actuator plate to the tip of the actuator plate.

Example Clause 17, the actuation device of any one of Example Clause 10 through 16, wherein the actuator plate is mechanically coupled to a scanning mirror, and wherein an amount of angular rotation that is induced into the scanning mirror increases directly with increases in the longitudinal curvature of the actuation device.

Example Clause 18, a system, comprising: a controller that generates drive signals; and an actuator that includes: an actuator plate that extends from a base that is affixed to a frame structure along a longitudinal axis to a tip that is coupled to an actuatable component, a plurality of transversely oriented stiffeners protruding from a first surface of the actuator plate, and an actuation material disposed on a second surface of the actuator plate that is opposite the first surface, wherein application of the drive signals to the actuation material results in a combination of transverse curvature, of the actuator plate, along a transverse axis, and longitudinal curvature, of the actuator plate, along the longitudinal axis.

Example Clause 19, the system of Example Clause 18, wherein the longitudinal curvature produces an actuator stroke that corresponds to a deflection of the tip of the actuator plate.

Example Clause 20, the system of any one of Example Clause 18 through 19, wherein a nominal height of the plurality of transversely oriented stiffeners is at least twenty times greater than a nominal thickness of the actuation material.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A microelectromechanical system (MEMS) actuation device, comprising:
   an actuator plate having a base that is mechanically coupled to a frame structure, wherein the actuator plate protrudes from the frame structure along a longitudinal axis that extends from the base of the actuator plate to a tip of the actuator plate;
   a piezoelectric film deposited on a first surface of the actuator plate, wherein activation of the piezoelectric film, via a drive signal, applies a bending moment to the actuator plate that causes:
      transverse curvature of the actuator plate along a transverse axis,
      and longitudinal curvature of the actuator plate along the longitudinal axis; and
   a plurality of structural stiffeners protruding from at least one of the first surface of the actuator plate or a second surface of the actuator plate that is opposite the first surface, wherein individual structural stiffeners are aligned substantially parallel to the transverse axis to increase a moment of inertia that resists the transverse curvature.

2. The MEMS actuation device of claim 1, wherein the piezoelectric film has a first nominal thickness and the actuator plate has a second nominal thickness that is at least three times greater than the first nominal thickness, and wherein individual structural stiffeners protrude a distance of at least three times the second nominal thickness.

3. The MEMS actuation device of claim 1, wherein the plurality of structural stiffeners protrude from the second surface of the actuator plate a distance that is at least twenty times a nominal thickness of the piezoelectric film.

4. The MEMS actuation device of claim 1, wherein the plurality of structural stiffeners includes at least three individual stiffeners that protrude from the actuator plate a distance that is at least three times a nominal thickness of the actuator plate.

5. The MEMS actuation device of claim 4, wherein the nominal thickness of the actuator plate is at least five times greater than a nominal thickness of the piezoelectric film.

6. The MEMS actuation device of claim 1, wherein the longitudinal curvature, of the actuator plate about the transverse axis with which the individual structural stiffeners are aligned substantially parallel to, produces an actuator stroke that corresponds to a deflection of the tip of the actuator plate.

7. The MEMS actuation device of claim 1, wherein the plurality of structural stiffeners protrudes from the second surface of the actuator plate that is opposite the first surface on which the piezoelectric film is deposited.

8. The MEMS actuation device of claim 1, wherein the piezoelectric film is lead zirconate titanate (PZT).

9. The MEMS actuation device of claim 1, wherein a length from the base of the actuator plate to the tip of the actuator plate is at least fifty times a nominal thickness of the actuator plate, and wherein the structural stiffeners protrude from the actuator plate a distance that is at least three times the nominal thickness of the actuator plate.

10. An actuation device, comprising:
    an actuator plate that protrudes from a frame structure along a longitudinal axis that extends from a base of the actuator plate to a tip of the actuator plate, wherein the actuator plate has a nominal thickness;
    a piezoelectric film that, upon activation via a drive signal, causes a combination of: transverse curvature of the actuator plate along a transverse axis and longitudinal curvature of the actuator plate along the longitudinal axis; and
    one or more transversely oriented structural stiffeners that are aligned substantially orthogonal to the longitudinal axis resist transverse curvature, of the actuator plate during the activation of the piezoelectric film, thereby at least partially mitigating increases to an area moment of inertia of the actuation device along the longitudinal axis, wherein individual transversely oriented structural stiffeners have a nominal height that is greater than the nominal thickness of the actuator plate.

11. The actuation device of claim 10, wherein the nominal height of the individual transversely oriented structural stiffeners is at least three times greater than the nominal thickness of the actuator plate.

12. The actuation device of claim 10, wherein the individual transversely oriented structural stiffeners protrude from a first surface of the actuator plate that is opposite a second surface, of the actuator plate, on which the piezoelectric film is disposed.

13. The actuation device of claim 12, wherein the nominal height that the individual transversely oriented structural stiffeners protrude from the first surface is at least twenty times greater than a nominal thickness of the piezoelectric film on the second surface.

14. The actuation device of claim 10, wherein the transverse bending produces an actuator stroke that corresponds to a deflection of the tip of the actuator plate.

15. The actuation device of claim 10, wherein the longitudinal axis extends linearly from the base of the actuator plate to the tip of the actuator plate.

16. The actuation device of claim 10, wherein the longitudinal axis is a curved axis that extends non-linearly from the base of the actuator plate to the tip of the actuator plate.

17. The actuation device of claim 10, wherein the actuator plate is mechanically coupled to a scanning mirror, and wherein an amount of angular rotation that is induced into the scanning mirror increases directly with increases in the longitudinal curvature of the actuation device.

18. A system, comprising:
a controller that generates drive signals; and
an actuator that includes:
- an actuator plate that extends from a base that is affixed to a frame structure along a longitudinal axis to a tip that is coupled to an actuatable component,
- a plurality of transversely oriented stiffeners protruding from a first surface of the actuator plate, and
- an actuation material disposed on a second surface of the actuator plate that is opposite the first surface, wherein application of the drive signals to the actuation material results in a combination of transverse curvature of the actuator plate along a transverse axis and longitudinal curvature of the actuator plate along the longitudinal axis.

19. The system of claim 18, wherein the longitudinal curvature produces an actuator stroke that corresponds to a deflection of the tip of the actuator plate.

20. The system of claim 18, wherein a nominal height of the plurality of transversely oriented stiffeners is at least twenty times greater than a nominal thickness of the actuation material.

* * * * *